(12) United States Patent
Sugiura et al.

(10) Patent No.: US 7,999,560 B2
(45) Date of Patent: Aug. 16, 2011

(54) INTERFERENCE EXCLUSION CAPABILITY TESTING APPARATUS

(75) Inventors: Toshihiro Sugiura, Aichi (JP); Masamune Takeda, Aichi (JP); Junichi Takahashi, Aichi (JP)

(73) Assignee: Masprodenkoh Kabushikikaisha, Aichi (JP)

( * ) Notice: Subject to any disclaimer, the term of this patent is extended or adjusted under 35 U.S.C. 154(b) by 545 days.

(21) Appl. No.: 12/084,451

(22) PCT Filed: Oct. 26, 2006

(86) PCT No.: PCT/JP2006/321408
§ 371 (c)(1),
(2), (4) Date: Apr. 30, 2008

(87) PCT Pub. No.: WO2007/049715
PCT Pub. Date: May 3, 2007

(65) Prior Publication Data
US 2009/0140750 A1    Jun. 4, 2009

(30) Foreign Application Priority Data
Oct. 27, 2005    (JP) .................................. 2005-313405

(51) Int. Cl.
*G01R 27/28* (2006.01)
*H01Q 13/00* (2006.01)
(52) U.S. Cl. ........................................ 324/627; 343/773
(58) Field of Classification Search .................. 324/627; 343/773
See application file for complete search history.

(56) References Cited

U.S. PATENT DOCUMENTS

| | | | | |
|---|---|---|---|---|
| 2,562,277 A * | 7/1951 | Kock | ............................. | 343/753 |
| 4,574,289 A * | 3/1986 | Henderson | ..................... | 343/786 |
| 5,305,001 A * | 4/1994 | Wong et al. | ..................... | 343/786 |
| 5,637,521 A * | 6/1997 | Rhodes et al. | ................ | 438/619 |
| 5,684,495 A * | 11/1997 | Dyott et al. | .................... | 343/785 |
| 6,452,561 B1 * | 9/2002 | West et al. | ..................... | 343/772 |
| 6,744,412 B1 * | 6/2004 | Lopez | ............................ | 343/799 |
| 6,788,244 B1 * | 9/2004 | Tam | ................................. | 342/22 |
| 6,963,253 B2 * | 11/2005 | Kovac et al. | ................. | 333/21 A |
| 7,183,991 B2 * | 2/2007 | Bhattacharyya et al. | ...... | 343/786 |
| 7,336,230 B2 * | 2/2008 | Lee et al. | ..................... | 343/703 |

FOREIGN PATENT DOCUMENTS

| | | | |
|---|---|---|---|
| JP | 5133989 A | | 5/1993 |
| JP | 11223611 A | | 8/1999 |
| JP | 2002296202 A | * | 10/2002 |
| JP | 2003098211 A | | 4/2003 |
| JP | 2004279072 A | | 10/2004 |
| JP | 2005236595 A | | 9/2005 |

OTHER PUBLICATIONS

Murano et al., "An Immunity Test Method Using Electromagnetic Wave of Rotating Polarization", IEEE Instrumentation and Measurement Technology Conference, May 20-22, 2003, pp. 1245-1250, Vail, Colorado, USA.

* cited by examiner

*Primary Examiner* — Jeff Natalini
(74) *Attorney, Agent, or Firm* — Kinney & Lange, P.A.

(57) ABSTRACT

An interference exclusion capability testing apparatus is provided for use in testing interference exclusion capability of a specimen by radiating an electromagnetic wave toward the specimen from a radiating antenna. The radiating antenna includes an electromagnetic horn, and a waveguide plate that guides an electromagnetic wave radiated from the electromagnetic horn to the specimen.

5 Claims, 14 Drawing Sheets

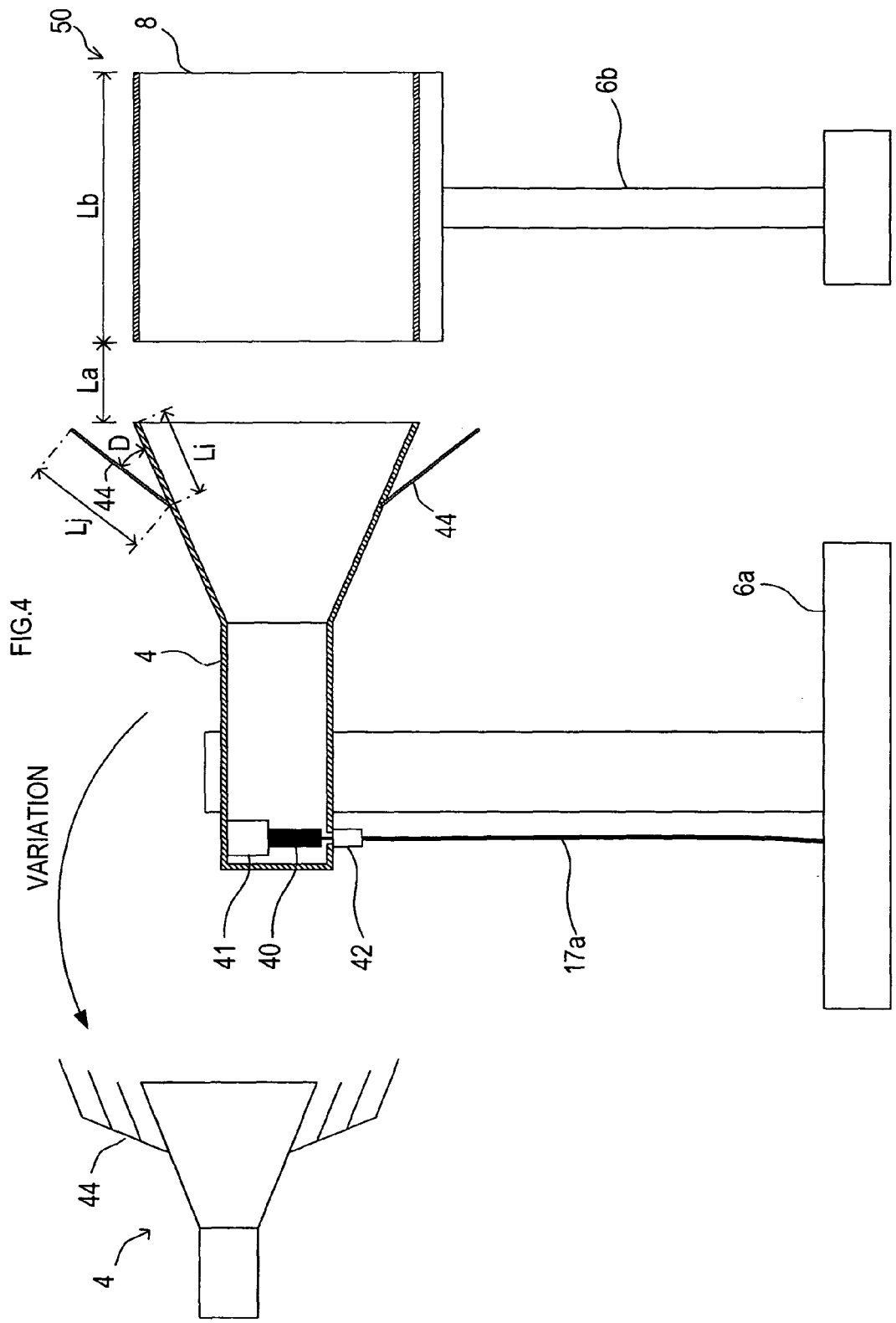

RADIATED WAVE: 1300 MHz FREQUENCY, VERTICALLY-POLARIZED WAVE

RECEPTION FIELD INTENSITY [V/m]

| | | DISTANCE BETWEEN ANTENNA AND WAVEGUIDE La[cm] | | | | | | | | | | |
|---|---|---|---|---|---|---|---|---|---|---|---|---|
| | | 0 | 5 | 10 | 15 | 20 | 25 | 30 | 35 | 40 | 45 | 50 | 55 |
| WAVEGUIDE LENGTH Lb[cm] | 25 | 350 | 361 | 343 | 343 | 357 | 347 | 347 | 343 | 389 | 407 | 396 | 392 |
| | 50 | 543 | 547 | 540 | 526 | 592 | 600 | 592 | 561 | — | — | — | — |
| | 75 | 754 | 736 | 743 | — | — | — | — | — | — | — | — | — |

HALF POWER AREA [cm]

| | DISTANCE BETWEEN ANTENNA AND WAVEGUIDE La[cm] | | | |
|---|---|---|---|---|
| | 0 | 10 | 20 | 30 |
| WAVEGUIDE LENGTH Lb=50[cm] | 23 | 20 | 16 | 13 |

RADIATED WAVE: 2900 MHz FREQUENCY, VERTICALLY-POLARIZED WAVE

RECEPTION FIELD INTENSITY [V/m]

| WAVEGUIDE LENGTH Lb[cm] | DISTANCE BETWEEN ANTENNA AND WAVEGUIDE La[cm] | | | | | | | | | | | | | |
|---|---|---|---|---|---|---|---|---|---|---|---|---|---|---|
| | 0 | 5 | 10 | 15 | 20 | 25 | 30 | 35 | 40 | 45 | 50 | 55 | 60 | 65 |
| 10 | 283 | 299 | 302 | 307 | 346 | 347 | 378 | 381 | 383 | 384 | 399 | 378 | 381 | 346 |
| 30 | 388 | — | 459 | — | 517 | — | 549 | — | 525 | — | 472 | — | — | — |
| 50 | 511 | — | 600 | — | 545 | — | — | — | — | — | — | — | — | — |
| 70 | 718 | 700 | 612 | — | — | — | — | — | — | — | — | — | — | — |

HALF POWER AREA [cm]

| | DISTANCE BETWEEN ANTENNA AND WAVEGUIDE La[cm] | | |
|---|---|---|---|
| | 0 | 10 | 20 |
| WAVEGUIDE LENGTH Lb=50[cm] | 11 | 10 | 9 |

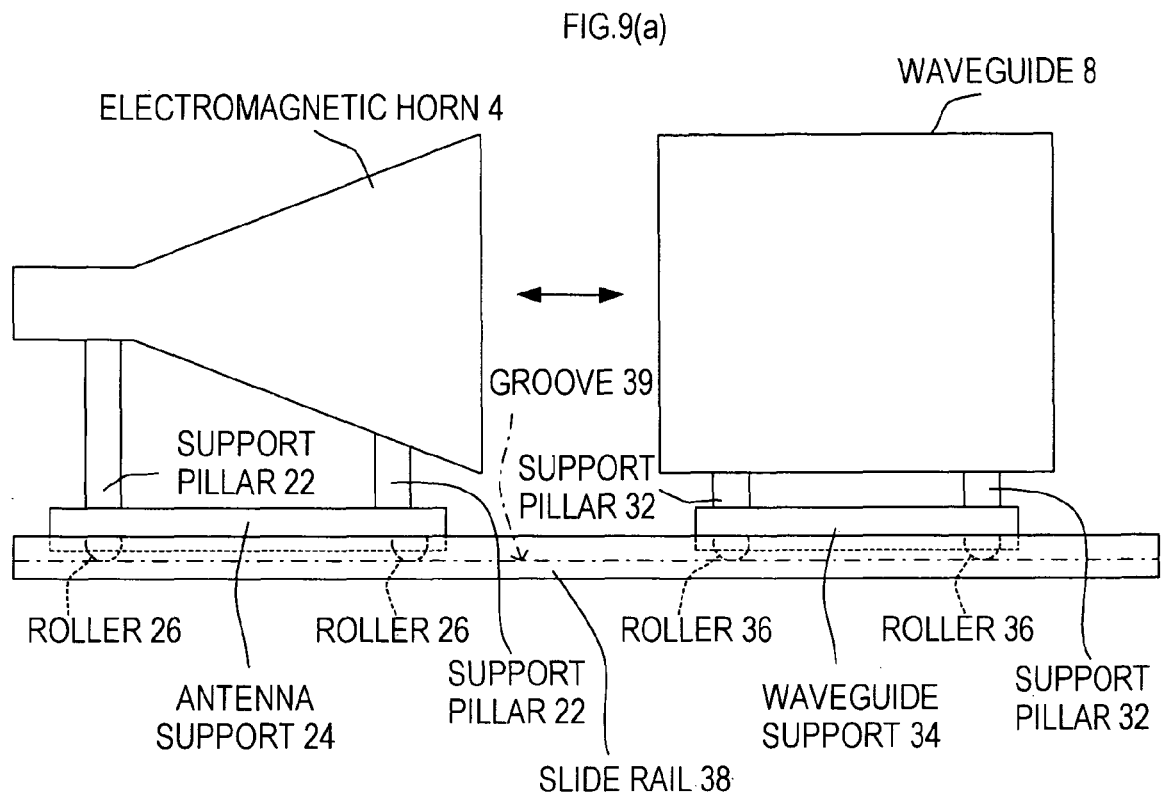
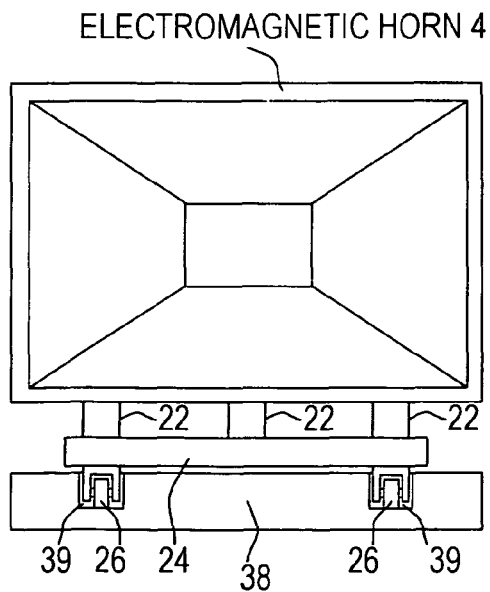
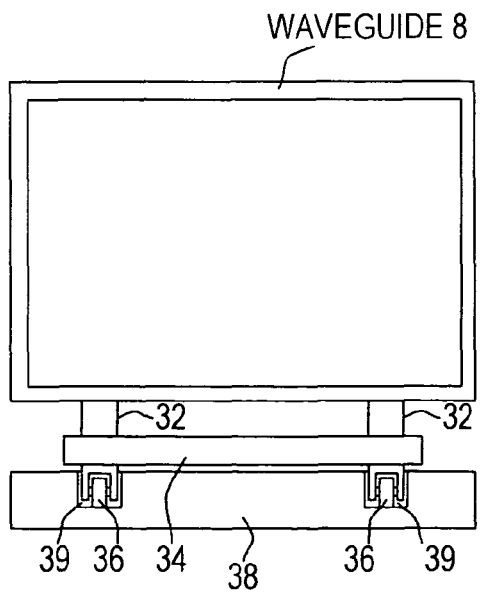

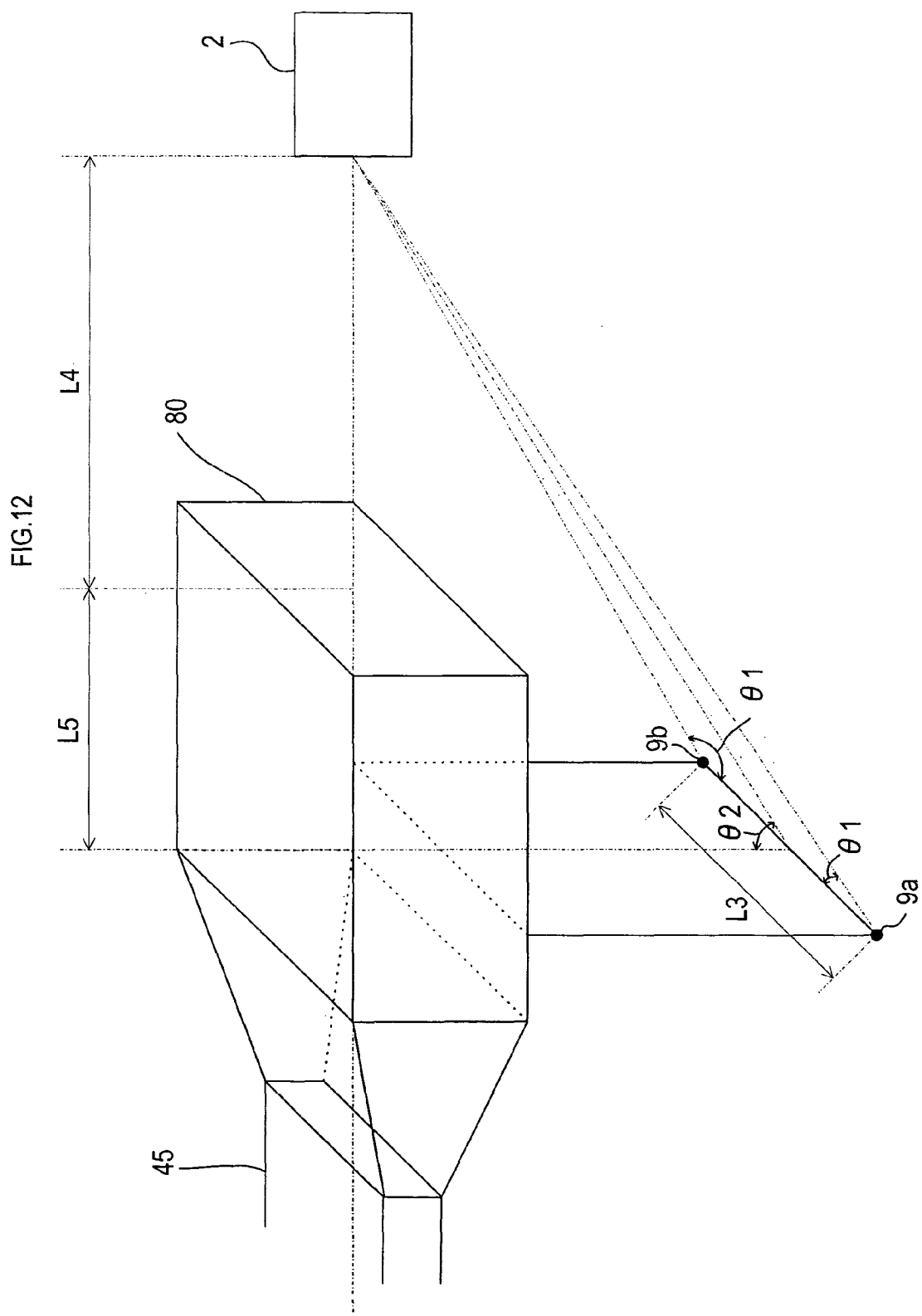

FIG.13(a) (a-1) (a-2)
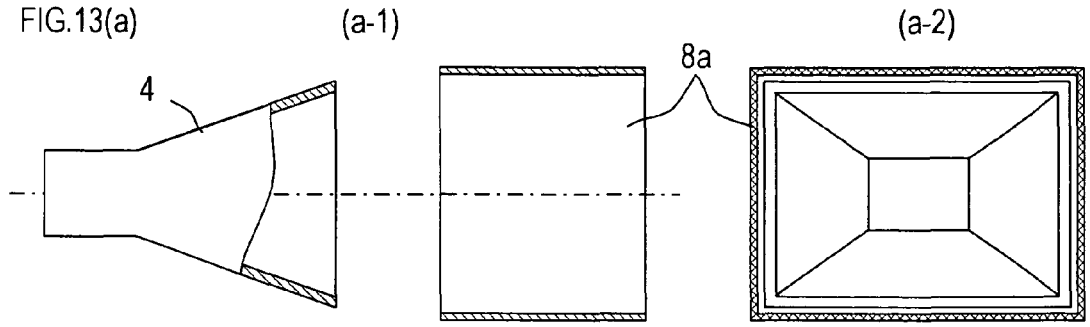
FIG.13(b) (b-1) (b-2)
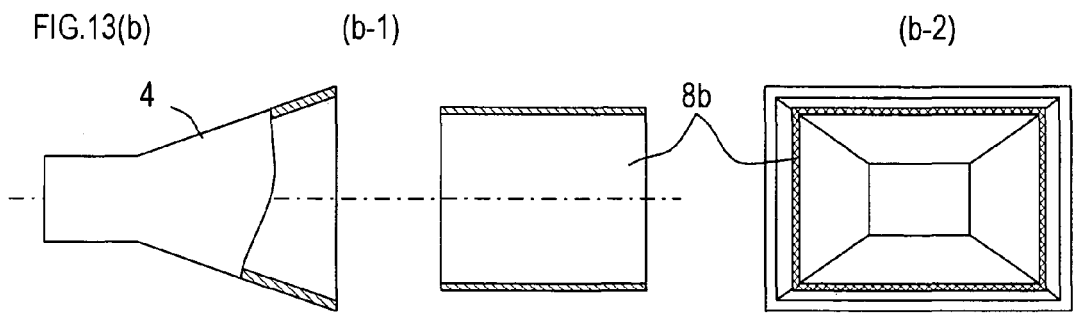
FIG.13(c) (c-1) (c-2)
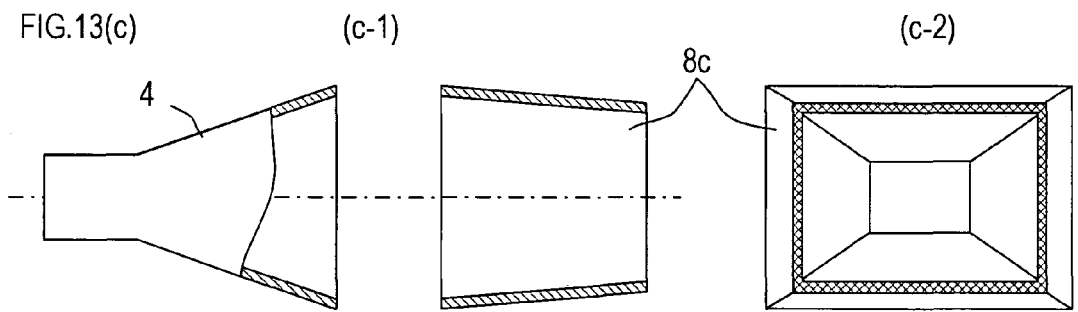
FIG.13(d) (d-1) (d-2)
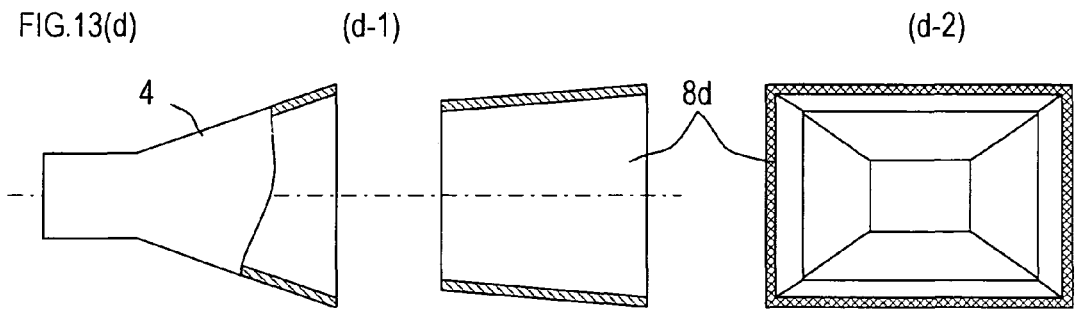
FIG.13(e) (e-1) (e-2)
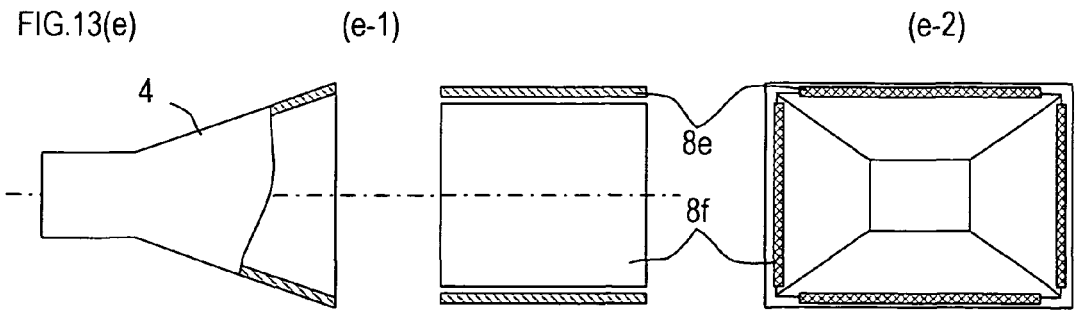

INTERFERENCE EXCLUSION CAPABILITY TESTING APPARATUS

TECHNICAL FIELD

The present invention relates to an interference exclusion capability testing apparatus for testing an interference exclusion capability (so-called immunity) of an electronic apparatus.

BACKGROUND ART

Conventionally, an immunity testing apparatus is provided with a specimen as a test article placed on a turn table standing on one end of a radio anechoic chamber and an antenna on an antenna support post standing on the other end of the radio anechoic chamber. Then, an electromagnetic wave radiated from the antenna is emitted onto a prescribed test plane where the specimen is disposed (see Patent Literature 1, for example).

Also, there are known test methods such as a radiated electromagnetic field testing method in which an electromagnetic wave of horizontally or vertically polarized wave is applied to a specimen arranged inside a radio darkroom from a biconical antenna or a log periodic antenna fixed inside the same radio darkroom, and a TEM waveguide method in which a TEM cell and a GTEM cell are used. There is also a method of applying a rotating electromagnetic field to a specimen (see Patent Literature 2, for example).

Patent Literature 1: Unexamined Japanese Patent Publication No. 7-55863

Patent Literature 2: Unexamined Japanese Patent Publication No. 2003-98211

SUMMARY

In a conventional immunity test, a field intensity of a test radio wave radiated from an antenna is designed to be set to 200 V/m which is relatively low. Accordingly, it is not possible to perform a sufficient immunity test sometimes, depending on usage of a product as a test article (specimen).

That is, for example if the product is mounted on a movable body such as an automobile and the movable body travels near a guidance radar apparatus used for departure/arrival of an airplane, there has been a problem that an electronic apparatus goes wrong and does not correctly function, or causes fatal error in some cases, even if the product has passed an immunity test with a test radio wave of a 200 V/m field intensity.

Thus, in a recent immunity test, a field intensity of a test radio wave is changed to 600 V/m in test conditions.

However, in the case of achieving the 600 V/m field intensity by a single amplifier and a single antenna as in the above proposed techniques, not only an antenna of high withstand voltage is required but also a power amplifier of high withstand voltage and high output is required. There is a problem that an interference exclusion capability testing apparatus is physically increased in size and of high cost.

The present invention has been made in view of the above problems. An object of the present invention is to provide an interference exclusion capability testing apparatus that can use a power amplifier of low-cost and low output.

The invention which was made in order to achieve the above object provides an interference exclusion capability testing apparatus for use in testing interference exclusion capability of a specimen by radiating an electromagnetic wave toward the specimen from a radiating antenna. The radiating antenna includes an electromagnetic horn, and a waveguide plate that guides an electromagnetic wave radiated from the electromagnetic horn to the specimen.

As above, since the interference exclusion capability testing apparatus of the present invention includes the waveguide plate that guides the electromagnetic wave radiated from the electromagnetic horn to the specimen, the electromagnetic wave from the electromagnetic horn can be efficiently radiated to the specimen. It is possible to reduce loss of the electromagnetic wave which occurs in a radiation path from the electromagnetic horn to the specimen, as compared to the case of simply radiating the electromagnetic wave from the electromagnetic horn.

Thus, according to the interference exclusion capability testing apparatus of the present invention, it is not necessary to use a power amplifier of high output upon input of a high frequency signal for transmission to the electromagnetic horn. The power amplifier can be of low output and achieve miniaturization and low cost of the interference exclusion capability testing apparatus.

Only one piece of waveguide plate is effective. However, it is more preferable that a plurality of waveguide plates are arranged to surround a part of a path of the electromagnetic wave from the electromagnetic horn to the specimen, as set forth in claim 2.

Also, as set forth in claim 3, if the waveguide plate is composed of a waveguide and the waveguide is arranged between the electromagnetic horn and the specimen, loss of the electromagnetic wave which occurs in the radiation path from the electromagnetic horn to the specimen can be more favorably reduced. The aforementioned effect can be better exerted. In this case, it is preferable that the waveguide is arranged such that a center axis of the wave guide is coaxial to a radial axis of the electromagnetic horn.

Also, in case that the waveguide plate is composed of a waveguide, it is preferable that the electromagnetic horn and the waveguide are arranged such that respective end faces of the electromagnetic horn and the waveguide are closely attached to each other, as set forth in claim 4. Then, the electromagnetic wave radiated from the radiating antenna can be efficiently radiated to the specimen. It is possible to provide an interference exclusion capability testing apparatus of less power loss.

Also, it is not always necessary to arrange the electromagnetic horn and the waveguide closely attached to each other on the end faces. The electromagnetic horn and the waveguide may be arranged with a space therebetween, as set forth in claim 5.

That is, even if the electromagnetic horn and the waveguide are arranged with a space therebetween, power loss can be further reduced in some cases by adjustment of the space, an axial length of the waveguide, etc., as compared to the case in which the electromagnetic horn and the waveguide are closely attached. Thus, the electromagnetic horn and the waveguide can be arranged with a space if the space between the electromagnetic horn and the waveguide, etc. is properly defined according to test conditions.

For example, in case that a distance from an open end face of the electromagnetic horn to the specimen and a frequency of the electromagnetic wave radiated from the electromagnetic horn are defined in test conditions for the specimen, it is desirable that the axial length of the waveguide is set to about half of the distance from the open end face of the electromagnetic horn to the specimen defined in the test conditions (particularly, a length of 0.8 to 1.2 times as long as ½ of the distance), and the space between the electromagnetic horn and the specimen is set to a distance approximately equal to a wavelength of the electromagnetic wave (particularly, a length of 0.8 to 1.2 times as long as the wavelength). These numerals are values that have been obtained by a later-explained experiment conducted by the present inventors, etc.

Also, from this experiment, it was found that a field intensity in an arranged position of the specimen and a half-power area (so-called quiet zone) in which the field intensity falls within a range from a maximum intensity to −3 dB are changed, if the electromagnetic horn and the specimen are arranged with a space therebetween and a width of the space is changed. That is, as the waveguide is moved close to the electromagnetic horn, the half-power area is widened but the field intensity becomes low. To the contrary, as the waveguide is moved away from the electromagnetic horn, the field intensity becomes high but the half-power area is narrowed.

Accordingly, in case that the half-power area and the field intensity are defined or a plurality of conditions are set in conditions of an immunity test, it is desirable that the space between the electromagnetic horn and the specimen can be arbitrarily adjusted. For this purpose, a support member may be provided which supports the waveguide to be attached to and detached from the electromagnetic horn, as set forth in claim 7.

Also, in this case, the support member may be provided with a wheel so as to be able to be moved. More preferably, the support member may be composed of a slide rail and a plurality of supports movably provided on the slide rail, as set forth in claim 8. That is, if constituted as such, the waveguide can be moved relative to the electromagnetic horn in a state that axial axes of the electromagnetic horn and the waveguide coincide with each other. Accordingly, axial misalignment between the electromagnetic horn and the specimen can be inhibited.

In case that an immunity test is performed by means of an electromagnetic wave of a linearly polarized wave, the electromagnetic horn may be provided with a rotating device that rotates the electromagnetic horn on a radial axis of the electromagnetic horn, as set forth in claim 9. That is, in this manner, a polarized wave face of the electromagnetic wave radiated to the specimen can be set at an arbitrary angle.

The electromagnetic horn radiates the electromagnetic wave forward from its open face. However, part of the electromagnetic wave radiated from the electromagnetic horn sometimes goes behind from the open face of the electromagnetic horn. Therefore, as set forth in claim 10, a reflector plate which reflects and guides the electromagnetic wave going behind from the open face to the specimen may be provided around the electromagnetic horn. In this manner, the electromagnetic wave from the electromagnetic horn can be more efficiently radiated to the specimen.

BRIEF DESCRIPTION OF THE DRAWINGS

FIG. 4 is an explanatory view showing a different embodiment of the radiating antenna.

FIG. 9($a$) to ($c$) are explanatory views showing an embodiment in which a space between an electromagnetic horn and a waveguide is adjustable.

FIG. 12 is an explanatory view for explaining a measuring method of a distance measurement device.

FIG. 13($a$) to ($e$) are explanatory views showing examples of other constitutions of the waveguide.

EXPLANATION OF REFERENCE NUMERALS

1 . . . interference exclusion capability testing apparatus, 2 . . . specimen, 3 . . . table, 4 . . . electromagnetic horn, 5 . . . radiating antenna, 6 . . . platform, 7 . . . radio anechoic chamber, 8, 8$a$ to 8$d$ . . . waveguide, 8$e$, 8$f$ . . . waveguide plate, 9 . . . distance measurement device, 10 . . . signal generator, 11 . . . wave absorber, 12 . . . radial axis, 13 . . . power amplifier, 14 . . . circulator, 15 . . . electric motor, 16 . . . belt for driving, 17 . . . power feeder, 18 . . . dummy resistor, 20 . . . transmitter, 40 . . . probe, 41 . . . holding body, 42 . . . connector, 44 . . . reflector plate, 45 . . . electromagnetic horn, 46 . . . end face, 47 . . . flange, 48 . . . opening, 50 . . . radiating antenna, 51 . . . radiating antenna, 60 . . . bearing, 61 . . . support body, 62 . . . pulley, 63 . . . pulley, 64 . . . roller, 65 . . . recess, 70 . . . radio anechoic chamber, 80 . . . waveguide, 81 . . . end face, 82 . . . flange, 90 . . . bolt, 91 . . . nut, 92 . . . through hole, 100 . . . interference exclusion capability testing apparatus

BEST MODE FOR CARRYING OUT THE INVENTION

Hereinafter, embodiments of the present invention will be explained in detail by way of drawings.

Embodiment 1

Figure 1:
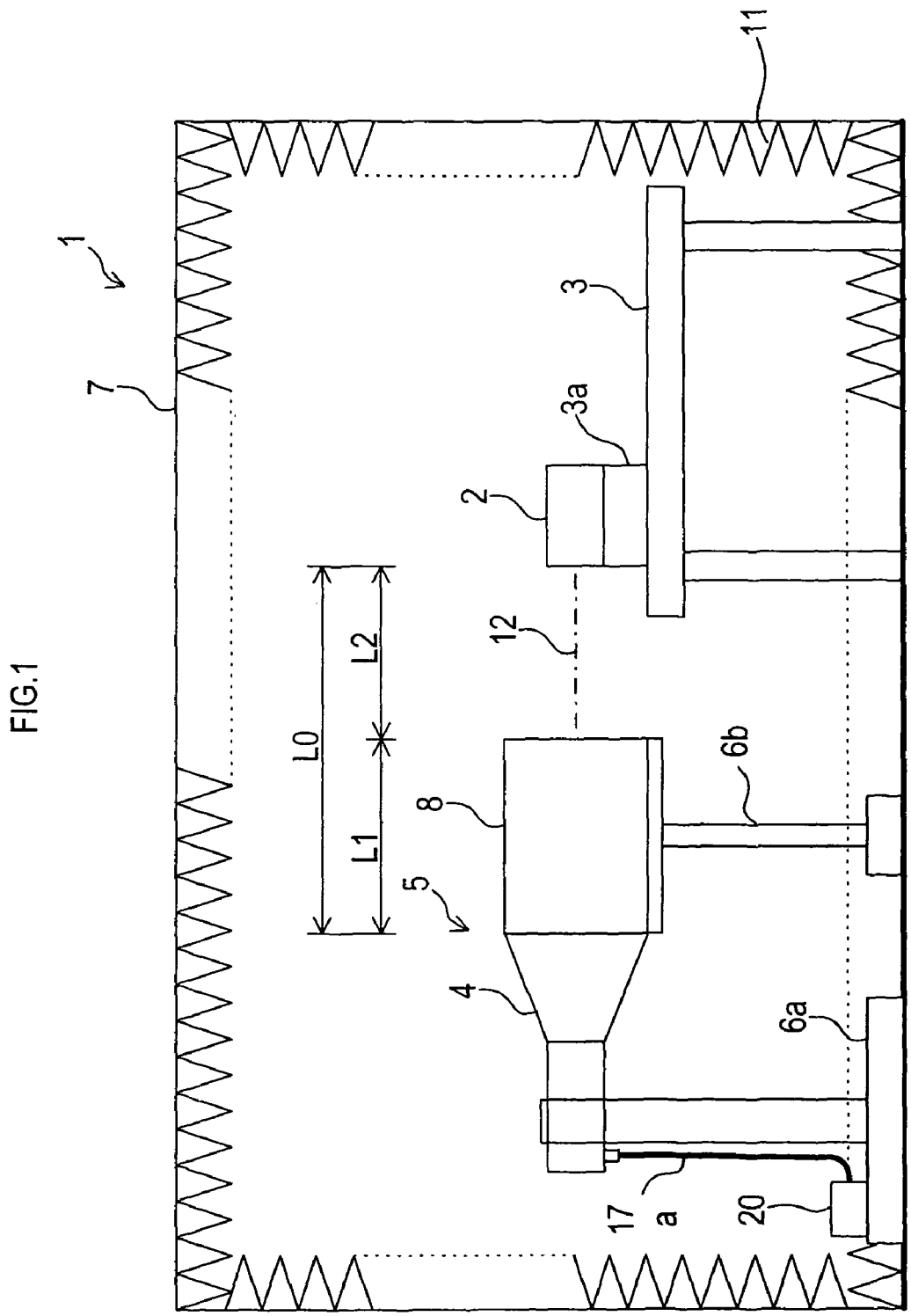
FIG. 1 is an explanatory view of an interference exclusion capability testing apparatus to which the present invention is applied.

FIG. 1 shows an explanatory view of an interference exclusion capability testing apparatus to which the present invention is applied. Reference numeral 1 denotes the interference exclusion capability testing apparatus. A wave absorber 11 is applied to a whole surface inside a radio anechoic chamber 7. An electromagnetic wave radiated to the inside of the radio anechoic chamber 7 and an electromagnetic wave reflected by a specimen, etc. are absorbed into the wave absorber 11 to be converted to heat energy.

A table 3 is provided on one end inside the radio anechoic chamber 7. A specimen 2 is mounted on the table 3 via a jig 3$a$ for height adjustment. A radiating antenna 5 is provided on the other end via a platform 6$a$ and a platform 6$b$. The radiating antenna 5 is composed of an electromagnetic horn 4 and a waveguide 8. The waveguide 8 and the specimen 2 are arranged on a radial axis 12 of the electromagnetic horn 4.

Reference numeral 17$a$ denotes a power feeder for connecting a later-explained circulator 14 and the radiating antenna 5 (more particularly, the electromagnetic horn 4). Reference numeral 20 denotes a transmitter.

L1 represents a length of the waveguide 8. L1 is set to be 50 cm for example, in the present embodiment. L2 represents a spatial distance from an open end of the waveguide 8 to the specimen 2. L2 is set to be 50 cm for example, in the present embodiment. L0 represents a distance from an open end of the electromagnetic horn 4 to the specimen. L0 is set to be 1 m in the present embodiment.

Figure 2:
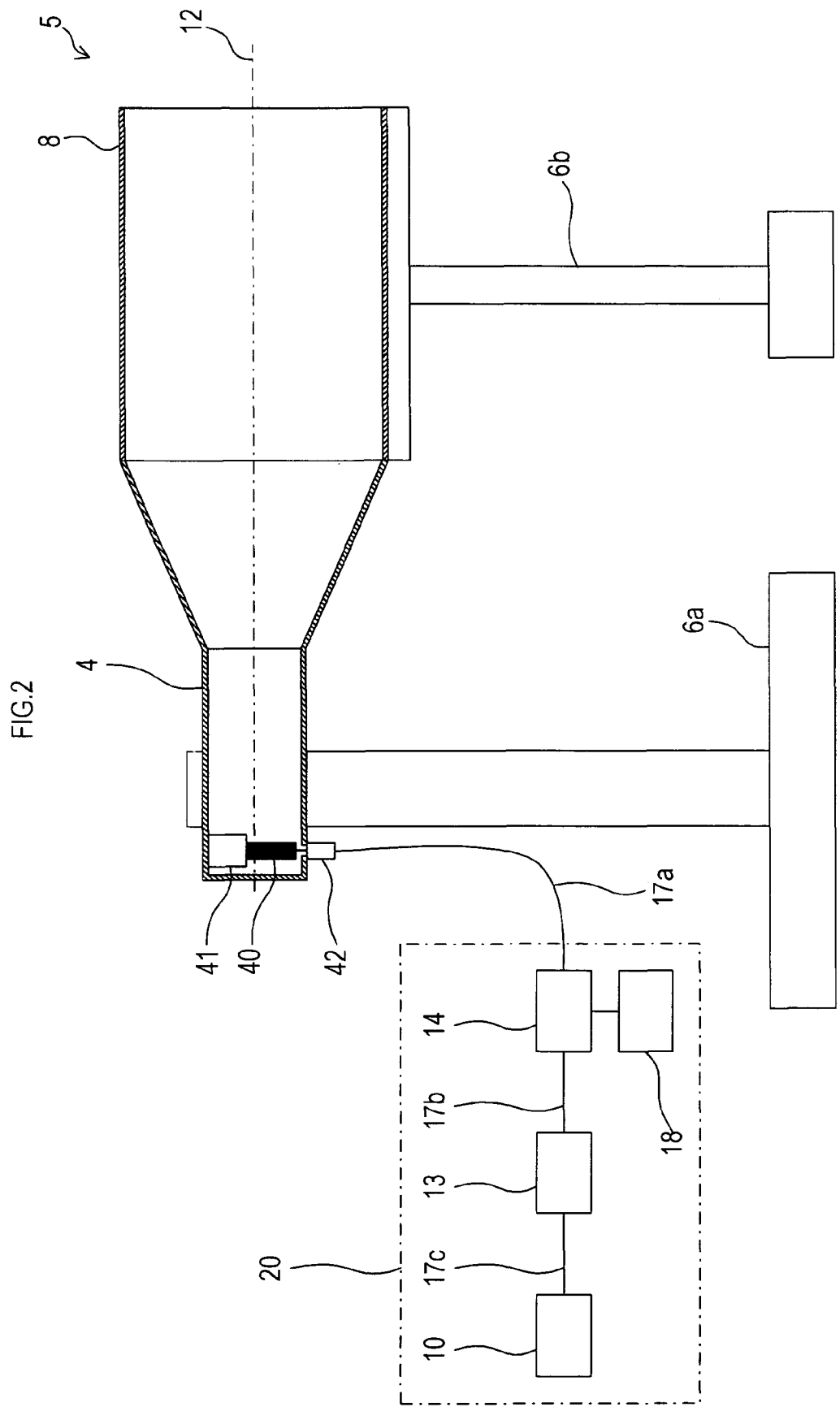
FIG. 2 is an explanatory view of a radiating antenna.

Now, detailed explanation on the radiating antenna 5 is given by way of FIG. 2. The radiating antenna 5 is composed of the electromagnetic horn 4 and the waveguide 8. A rectangular electromagnetic horn which is opened on one end is used as the electromagnetic horn 4. On the other end of the electromagnetic horn 4, a probe 40 is arranged between a holding body 41 and a connector 42. A power feeder 17a is connected to the connector 42. The holding body 41 is formed of a dielectric body.

A rectangular waveguide having an opening formed to be identical in shape to an opening of the electromagnetic horn 4 is used as the waveguide 8. The electromagnetic horn 4 and the waveguide 8 are arranged such that the radial axis 12 of an electromagnetic wave radiated from the electromagnetic horn 4 coincides with a center axis of the waveguide 8. Respective end faces of the electromagnetic horn 4 and the waveguide 8 are closely attached to each other.

The waveguide 8 is formed of a conductive material. The waveguide 8 may be formed of fiber into which a conductive material is woven. Also, the waveguide 8 may be formed into a net if intervals of meshes of the nest are shorter than one fourth of a wavelength of a frequency used. If the waveguide 8 is formed of fiber or into a net, reduction in weight of the waveguide can be achieved. Although a rectangular electromagnetic horn and a rectangular waveguide are used in the present embodiment, a circular electromagnetic horn and a circular waveguide may be also used.

Now, explanation on the transmitter 20 is given. As shown in FIG. 2, the transmitter 20 includes a signal generator 10, a power amplifier 13, the circulator 14, and a dummy resistor 18. Reference numeral 10 denotes the signal generator. In the present embodiment, an oscillator that sweeps from 1 to 1.5 GHz is used as the signal generator 10. Reference numeral 13 denotes the power amplifier. Although the circulator 14 and the dummy resistor 18 are used in the present embodiment, an isolator may be used instead.

Now, explanation on operation is given. A sweep signal from 1 to 1.5 GHz generated by the signal generator 10 is amplified by the power amplifier 13 (50 W is used in the present embodiment). The amplified high frequency signal is supplied to the electromagnetic horn 4 via the circulator 14. An electromagnetic wave radiated from the electromagnetic horn 4 via a probe 40 is transmitted through the waveguide 8 of less transmission loss to be radiated to the specimen 2. In the case of the present embodiment, since the electromagnetic horn 4 and the waveguide 8 having the opening identical in shape to the opening of the electromagnetic horn 4 are arranged closely attached to each other, the electromagnetic wave radiated from the electromagnetic horn 4 can be efficiently guided to the waveguide 8 without loss.

The electromagnetic wave guided to the waveguide 8 is radiated to the specimen 2 from the other end face of the waveguide 8. As a result, a uniform electromagnetic field is generated on a test plane (of φ30 cm, in the present embodiment) of the table 3 on which the specimen 2 is mounted.

In case that it becomes necessary to change the test plane due to size of the specimen 2 mounted on the table 3, a position of a test site, etc., the jig 3a for height adjustment may be changed or the height, etc. of the platform 6 and the table 3 may be changed so that the electromagnetic wave can be radiated to the test plane.

The electromagnetic wave radiated from the radiating antenna 5 may be reflected on a metal portion of the specimen and received by the radiating antenna 5. The circulator 14 is provided to inhibit malfunction or failure of the power amplifier 13 due to application of the received power to the power amplifier 13.

Now, a supply capability of the electromagnetic horn 4 is calculated which is necessary to achieve a 600 V/m field intensity at 1.3 GHz on the test plane.

Firstly, 600 (V/m) in reception field intensity is converted to a unit of (dBµ/m).

reception field intensity $A=20 \times \mathrm{Log}(600 \times 10^6)$

Accordingly, A=175.56 (dBµ/m).

Next, the field intensity (dBµ/m) is converted to a voltage (dBµ).

voltage $Et = E + G + Le - (Lf \times L) - 6$ wherein
Et: receiver input signal voltage (dBµ),
E: field intensity (dBµ/m),
G: antenna gain (dBi)
Le: active antenna length (dB)=$20 \times \mathrm{Log}(\lambda/\pi)$,
λ: wavelength (m),
Lf: cable loss per unit length (dB/m),
L: cable length (m), and
value 6: correction value for conversion from open value to terminal value.

Accordingly, if the antenna gain G=0 dBi and the cable length L=0 m, $\lambda = (3 \times 10^8)/(1.3 \times 10^9) = 0.23$ (m), $Le = 20 \times \mathrm{Log}(0.23/3.14) = -22.7$ (dB), $Et = 175.56 - 22.7 - 6 = 146.86$ (dBµ).

Next, the voltage (dBµ) is converted to an electric power (dBm).

electric power $Pi = Et - 20 \times \mathrm{Log}(\sqrt{0.001} \times \sqrt{50 \times 10^6})$ wherein
Pi: reception level (dBm), and Et: receiver input signal voltage (dBµ).

Accordingly, electric power $Pi = 146.86 - 20 \times 5.35 = 39.86$ (dBm).

Here, if a loss G1 from the end face of the electromagnetic horn 4 to one end face (on the side which is in contact with the electromagnetic horn) of the waveguide 8 is 1 dB, a loss G2 of the waveguide 8 is 1 dB, and a loss G3 from the other end face of the waveguide 8 to the test plane is 5 dB, then a supply capability P of the electromagnetic horn 4 is, from the above equation, $$\begin{aligned} P &= Pi + G1 + G2 + G3 \\ &= 39.86 + 1 + 1 + 5 \\ &= 46.86 \text{ (dBm)} \\ &= 48.5 \text{ (W)}. \end{aligned}$$

As a result of experiments by the inventors, it was found that the loss G3 from an open end of the waveguide 8 to the test plane is 5 dB. That is, the loss from the open end of the waveguide 8 to the test plane is 28.7 dB if calculated as a free space loss. However, it was found that, if the electromagnetic horn 4 and the waveguide 8 are closely arranged as in the present embodiment, the loss is substantially reduced (23.7 dB). It is believed that the reason for this is because most of energy of the electromagnetic wave radiated from the open end of the waveguide 8 is converged and radiated to a test space on the table 3 on which the specimen 2 is mounted.

In order to obtain a 600 V/m field intensity in a conventional manner in which radiation is performed to a free space, a supply capability of 28 (KW) is required if a distance between a transmission point and a reception point is 1 m, as shown below.

A supply capability Pf in case that radiation performed to a free space is obtained from an equation below.

$$Pf = P1 + G0$$

Here,
G0=free space propagation loss (dB) in case that the distance between the transmission and reception points is 1 m =34.7 (dB).
Accordingly, $$Pt = 39.86 + 34.7$$
$$= 74.56 \text{ (dBm)}$$
$$= 28576 \text{ (W)}.$$

As a result, the interference exclusion capability testing apparatus of the present embodiment can achieve a required performance with a supply capability of about one 600th of that of the case as before in which the electromagnetic wave is directly radiated from the radiating antenna to the specimen.

As noted above, in the present embodiment, since the electromagnetic wave radiated from the electromagnetic horn 4 is guided to the waveguide 8, a loss in a propagation path (a total loss of 7 dB in the present embodiment, since the loss G1 from the end face of the electromagnetic horn 4 to one end of the waveguide 8 is 1 dB, the loss G2 of the waveguide 8 is 1 dB, and the loss G3 from the other end face of the waveguide 8 to the test plane is 5 dB) is smaller than a loss in a propagation path in a conventional method in which radiation is performed to a free space (a transmission distance between transmission and reception is 1 m, the free space propagation loss G0 at a frequency of 1.3 GHz is 34.7 dB). As a result, an excellent effect is achieved in which an electric power to be supplied to an antenna can be reduced to about one 600th.

Also, in the present embodiment, the circulator 14 is provided on an input side of the electromagnetic horn 4. Thus, it is possible to inhibit malfunction or failure of the amplifier 13 due to application of the electromagnetic reflected by a metal portion, etc. of the specimen 2 and returned from an output terminal of the amplifier 13.

Embodiment 2

Figure 3:
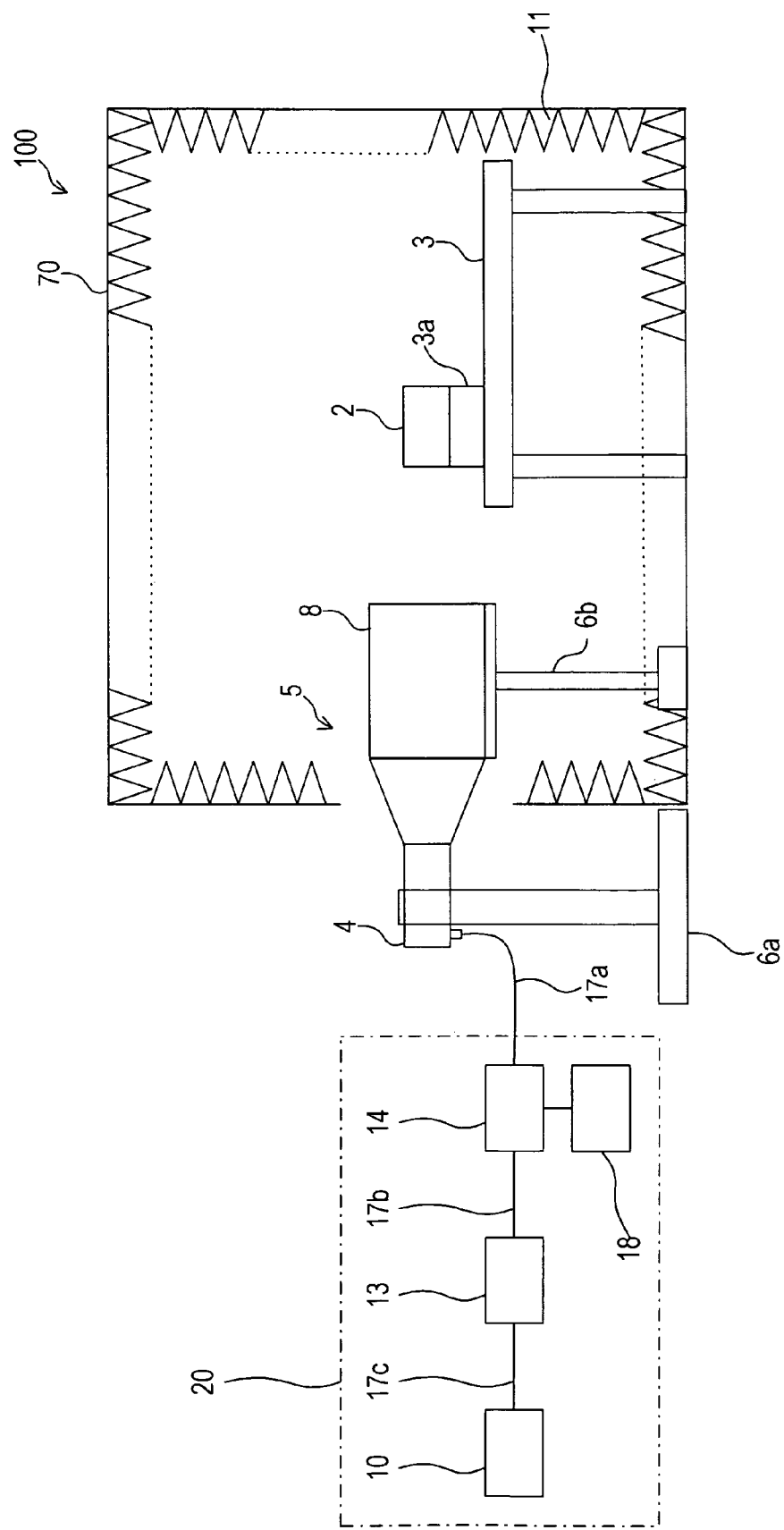
FIG. 3 is an explanatory view showing a different embodiment of the present invention.

Now, explanation on a second embodiment of the present invention is given referring to FIG. 3.

In the following description, the same reference numeral is given to the same component as that of the interference exclusion capability testing apparatus of the first embodiment, and the detailed explanation is not repeated.

In an interference exclusion capability testing apparatus 100 in FIG. 3, a small-sized radio anechoic chamber 70 is used which has an opening on a wall face and is short in a radiation direction of electromagnetic wave, instead of the radio anechoic chamber 7 of the first embodiment.

Also, the present embodiment is different from the first embodiment in that the electromagnetic horn 4 and the platform 6a on which the electromagnetic horn 4 is mounted are disposed outside the radio anechoic chamber 70.

An opening of the electromagnetic horn 4 is projected into the radio anechoic chamber 70 from the opening provided on the wall face of the wave anechoic chamber 70.

The waveguide 8 is arranged to be brought into contact with the projected opening of the electromagnetic horn 4. Such an arrangement simplifies operation of the apparatus such as the signal generator 10 and the power amplifier 13 and improves operability when an interference exclusion capability test is performed.

Embodiment 3

Now, explanation on a third embodiment of the present invention is given referring to FIG. 4.

In the following description, the same reference numeral is given to the same component as that of the interference exclusion capability testing apparatus of the first embodiment, and the detailed explanation is not repeated.

As shown in FIG. 4, a difference between the first embodiment and the present embodiment is that the electromagnetic horn 4 and the waveguide 8 which compose the radiating antenna 50 are arranged spaced from each other such that their respective end faces are spaced by a distance La, and a reflection plate 44 that reflects the electromagnetic wave going behind from the open face of the electromagnetic horn 4 to be guided to the specimen is provided on each of upper and lower peripheral faces of the electromagnetic horn 4.

In case that the electromagnetic horn 4 and the waveguide 8 are arranged spaced from each other as such, the transmission loss is slightly increased but the reflected electric power reflecting the electromagnetic wave radiated from the electromagnetic horn 4 by a metal body such as the specimen 2 and returned to the electromagnetic horn 4 can be attenuated by a space propagation loss of the space distance La. Furthermore, failure of the isolator 14, the dummy resistor 18 and the power amplifier 13 can be inhibited.

Also, in case that the electromagnetic horn 4 and the waveguide 8 are arranged with a space therebetween as such, it was found from experiments by the present inventors that a power loss can be reduced as compared to the case in which the electromagnetic horn 4 and the waveguide 8 are closely attached to each other, if the space (that is, the distance La between the antenna and the waveguide) and an axial length Lb of the waveguide 8 (see FIGS. 5(*a*) to (*c*)) are adjusted.

Hereinafter, explanation on the experiments is given.

Experiment 1

Under test conditions that a length from the open end face of the electromagnetic horn 4 to the specimen is 1 m and the frequency of the electromagnetic wave is 1.3 GHz, the space between the electromagnetic horn 4 and the waveguide 8 (distance La between the antenna and the waveguide) which can best reduce a power loss and the axial length Lb of the waveguide 8 are to be found. For this purpose, as shown in FIG. 5(*a*), the electromagnetic horn 4 without the reflection plate 44 and the waveguide 8 are arranged with the space La on the radial axis of the electromagnetic horn 4. Moreover, a field probe for reception field intensity measurement is disposed at a position 1 m (100 cm) away from the open end face of the electromagnetic horn 4 on the radial axis of the electromagnetic horn 4.

Also, in this experiment, in accordance with specific test conditions actually existing in an immunity test, a height from the floor face of the axial axis of the electromagnetic horn 4 and a height from the floor face of an electromagnetic probe were respectively defined as 100 cm and 105 cm. A metal plate was horizontally arranged at a position 15 cm below the field probe. The metal plate was protruded 10 cm from the field probe to the side of the waveguide 8.

As the waveguide 8, waveguides having the axial length Lb of 25 cm, 50 cm, and 75 cm were used. The distance (distance between the antenna and the waveguide) La from the open end face of the electromagnetic horn 4 to the open end face of the waveguide 8 was varied by moving the waveguide 8 on the radial axis. A reception field intensity obtained by the field probe was measured.

Figures 5A, 5B, 5C:
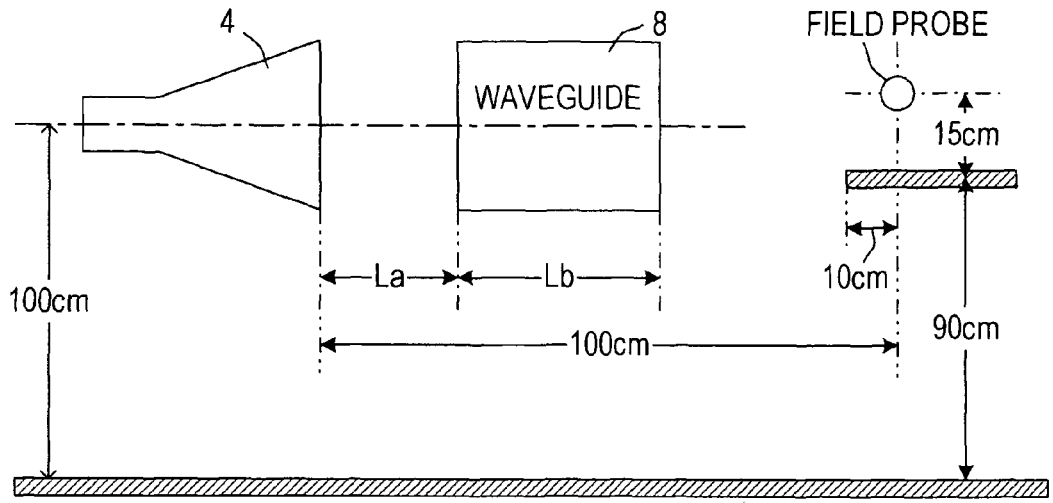
FIG. 5($a$) to ($c$) are explanatory views showing test conditions of an experiment 1 and the experimental results.
Figure 6A:
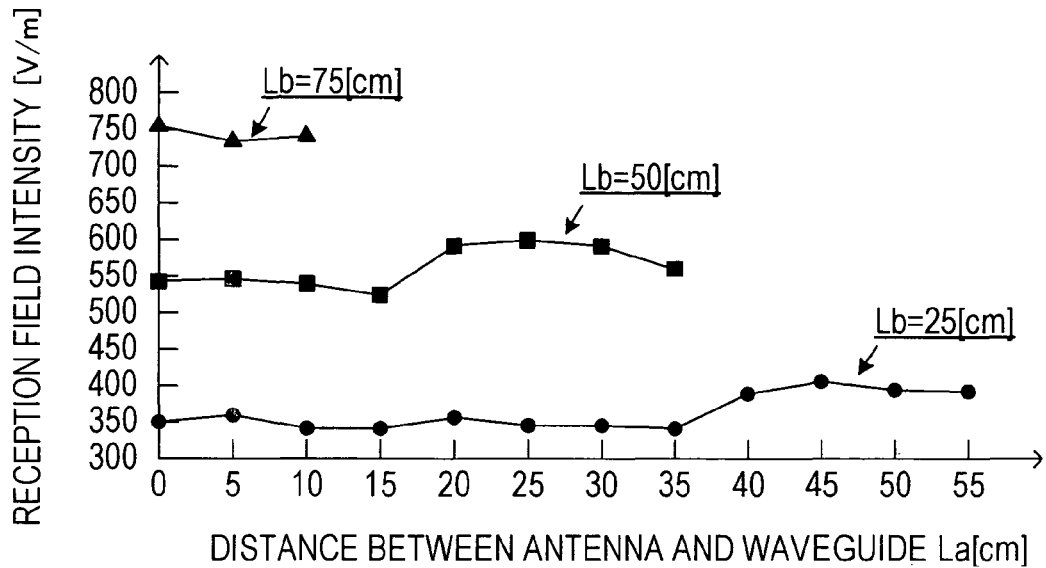
FIG. 6($a$), ($b$) are graphs showing the experimental results from the experiment 1.

Measurement results are shown in FIG. 5(b) and FIG. 6(a). The measurement results are measurement results in case that a frequency f of the electromagnetic wave radiated from the electromagnetic horn 4 is set at 1.3 GHz.

As is clear from FIG. 5(b) and FIG. 6(a), under the aforementioned test conditions, it was found that close attachment of the electromagnetic horn 4 and the waveguide 8 reduces the transmission loss better than spaced arrangement of the electromagnetic horn 4 and the waveguide 8, if the length Lb of the waveguide 8 is 75 cm, while spaced arrangement of the electromagnetic horn 4 and the waveguide 8 reduces the transmission loss better than close arrangement of the electromagnetic horn 4 and the waveguide 8, if the length Lb of the waveguide 8 is 50 cm and 25 cm.

Also, it was found that the distance La between the antenna and the waveguide which can best reduce the transmission loss of the electromagnetic wave is about 25 cm when the length Lb of the waveguide 8 is 50 cm, and the distance La between the antenna and the waveguide which can best reduce the transmission loss of the electromagnetic wave is about 45 cm when the length Lb of the waveguide 8 is 25 cm.

Experiment 2

Figures 7A, 7B, 7C:
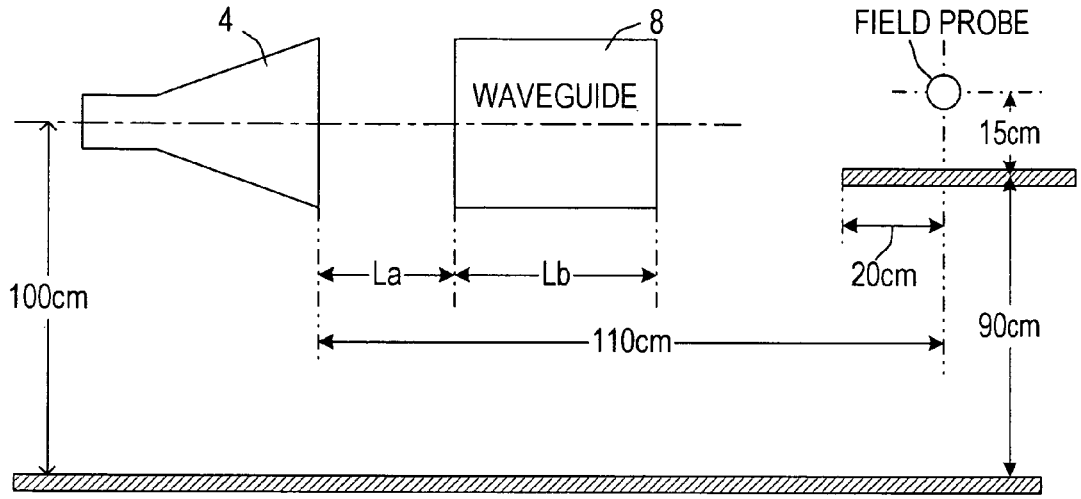
FIG. 7($a$) to ($c$) are explanatory views showing test conditions of an experiment 2 and the experimental results.

Under test conditions that a length from the open end face of the electromagnetic horn 4 to the specimen is 1.1 m and the frequency of the electromagnetic wave is 2.9 GHz, the space between the electromagnetic horn 4 and the waveguide 8 (distance La between the antenna and the waveguide) which can most reduce a power loss and the axial length Lb of the waveguide 8 are to be found. For this purpose, as shown in FIG. 7(a), the electromagnetic horn 4 without the reflection plate 44 and the waveguide 8 are arranged with the space La on the radial axis of the electromagnetic horn 4. Moreover, a field probe for a reception field intensity measurement is disposed at a position 1.1 m (110 cm) away from the open end face of the electromagnetic horn 4 on the radial axis of the electromagnetic horn 4.

Also, in this experiment, in accordance with specific test conditions actually existing in an immunity test, a height from the floor face of the axial axis of the electromagnetic horn 4 and a height from the floor face of the electromagnetic probe were respectively set to 100 cm and 105 cm. A metal plate was horizontally arranged at a position 15 cm below the field probe. The metal plate was protruded 20 cm from the filed probe to the side of the waveguide 8.

The waveguide 8 having the axial length Lb of 10 cm, 30 cm, 50 cm and 70 cm was used. The distance (distance between antenna and waveguide) La from the open end face of the electromagnetic horn 4 to the open end face of the waveguide 8 was varied by moving the waveguide 8 on the radiation axis. A reception field intensity obtained by the field probe was measured.

Figure 8A:
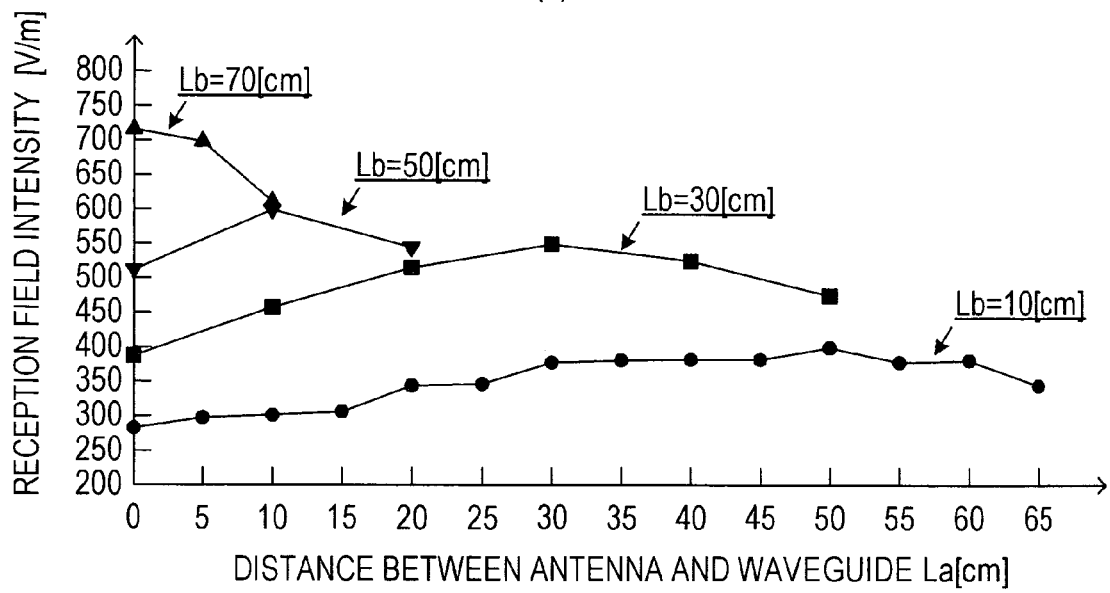
FIG. 8($a$), ($b$) are graphs showing the experimental results from the experiment 2.

Measurement results are shown in FIG. 7(b) and FIG. 8(a). The measurement results are measurement results in case that a frequency f of the electromagnetic wave radiated from the electromagnetic horn 4 is set at 2.9 GHz.

As is clear from FIG. 7(b) and FIG. 8(a), under the aforementioned test conditions, it was found that close attachment of the electromagnetic horn 4 and the waveguide 8 reduces the transmission loss better than spaced arrangement of the electromagnetic horn 4 and the waveguide 8, if the length Lb of the waveguide 8 is 70 cm, while spaced arrangement of the electromagnetic horn 4 and the waveguide 8 reduces the transmission loss better than close arrangement of the electromagnetic horn 4 and the waveguide 8, if the length Lb of the waveguide 8 is 50 cm, 30 cm and 10 cm.

Also, it was found that the distance La between the antenna and the waveguide which can best reduce the transmission loss of the electromagnetic wave is about 10 cm when the length Lb of the waveguide 8 is 50 cm, the distance La between the antenna and the waveguide which can best reduce the transmission loss of the electromagnetic wave is about 30 cm when the length Lb of the waveguide 8 is 30 cm, and the distance La between the antenna and the waveguide which can best reduce the transmission loss of the electromagnetic wave is about 50 cm when the length Lb of the waveguide 8 is 10 cm.

From each of the above experimental results, it was found that, since the reception field intensity itself becomes larger as the waveguide 8 becomes longer, the length Lb of the waveguide 8 is preferably set to about a half length (50 cm) of the distance (100 cm, 110 cm) from the open end face of the electromagnetic horn 4 and the specimen 8 defined by the test conditions, and the space between the electromagnetic horn 4 and the waveguide 8 is preferably set to a distance (25 cm, 10 cm) substantially equal to the wavelength $\lambda$ (about 23 cm at 1.3 GHz, about 10 cm at 2.9 GHz) of the electromagnetic wave, when the electromagnetic horn 4 and the waveguide 8 are arranged spaced from each other.

Such experiments were performed under various conditions. It was found that the length Lb of the waveguide 8 is preferably set to 0.8 to 1.2 times as long as half the distance from the open end face of the electromagnetic horn 4 and the specimen 8 defined by the test conditions, and the space between the electromagnetic horn 4 and the waveguide 8 is preferably set to 0.8 to 1.2 times as long as the wavelength $\lambda$ (about 23 cm at 1.3 GHz, about 10 cm at 2.9 GHz) of the electromagnetic wave, when the electromagnetic horn 4 and the waveguide 8 are arranged spaced from each other.

Figure 6B:
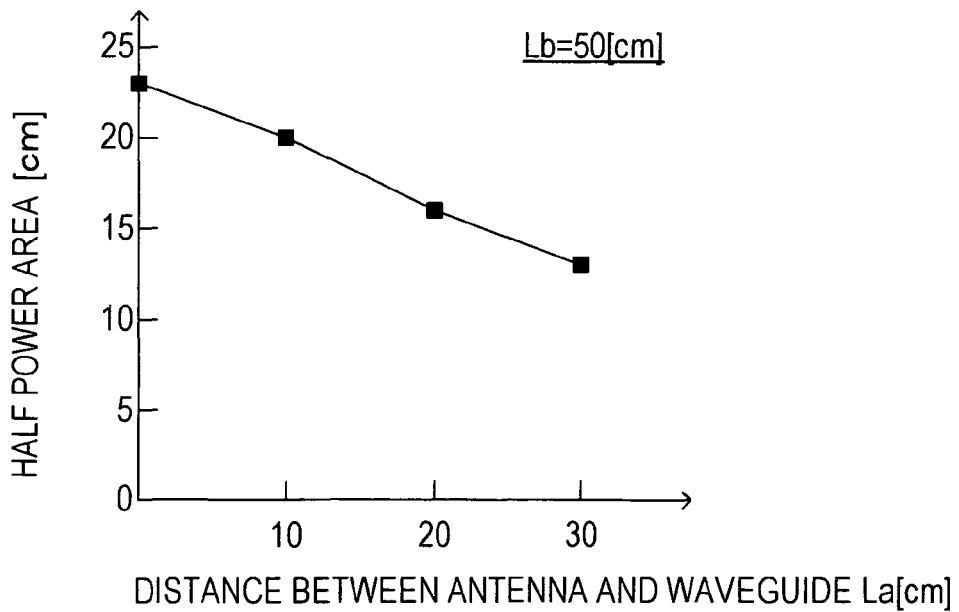
Figure 8B:
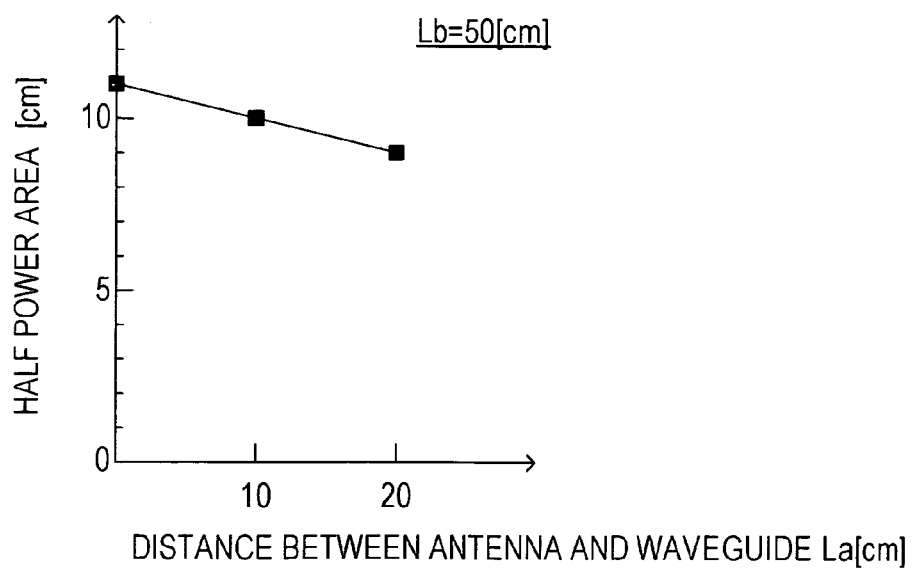

Also, in each of the above experiments 1 and 2, it was found that not only the reception field intensity at an arrangement position of the specimen but also a half power area (so-called quiet zone) which falls in a range from the maximum intensity to −3 dB is varied, when the distance La between the electromagnetic horn 4 and the waveguide 8 is varied. That is, as shown in FIG. 5(c) and FIG. 6(b), or in FIG. 7(c) and FIG. 8(b), the half power area becomes wider as the waveguide 8 is brought closer to the electromagnetic horn 4.

Accordingly, when a specimen is constituted which can execute an immunity test in various conditions including a half power area, it is desirable that the space between the electromagnetic horn 4 and the waveguide 8 can be arbitrarily adjusted in accordance with the test conditions.

For this purpose, as shown in FIGS. 9(a) to (c), it is preferable that the electromagnetic horn 4 and the waveguide 8 are respectively fixed on an antenna support 24 or a waveguide support 34 via a support pillar 22 or a support pillar 32, and the space between the electromagnetic horn 4 and the waveguide 8 can be arbitrarily set by slidably arranging the supports 24 and 34 on a slide rail 38 to be moved on the slide rail 38.

In this manner, the space between the electromagnetic horn 4 and the waveguide 8 can be adjusted in a state that center axes of the electromagnetic horn 4 and the waveguide 8 coincide with each other. Thus, axial misalignment between the electromagnetic horn 4 and the waveguide 8 can be inhibited.

Also, in apparatus shown in FIGS. 9(*a*) to (*c*), the electromagnetic horn 4 can be moved on the slide rail 38. Thus, the space between the electromagnetic horn 4 and the waveguide 8 can be adjusted in a state that the slide rail 38 is fixed. For example even if there are a test condition in which the space between the electromagnetic horn 4 and the waveguide 8 is 1 m and a test condition in which the space between the electromagnetic horn 4 and the waveguide 8 is 1.1 m, an experiment under each of these conditions can be easily performed.

In FIG. 9, (*a*) is a side view of the electromagnetic horn 4 and the waveguide 8 viewed from a lateral direction, (b) is a front view of the electromagnetic horn 4 viewed from the side of the open face, and (c) is a front view of the waveguide 8 viewed from the side of the open face.

As is clear from these views, two grooves 39 are formed on the slide rail 38. A plurality of rollers (wheels) 26, 36 rotated along the grooves 39 are provided below the antenna support 24 and the waveguide support 34. Accordingly, the electromagnetic horn 4 and the waveguide 8 can be extremely easily moved along the grooves on the slide rail 38.

In the interference exclusion capability testing apparatus of the present embodiment shown in FIG. 4, the reflection plate 44 is provided on each of the upper and lower peripheral faces of the electromagnetic horn 4. Each of the reflection plate 44 is fixed to a position that is a distance Li of 20 cm away from the open end in the peripheral face of the electromagnetic horn 4. Also, an angle D between a plate face of each of the reflection plates 44 and the peripheral face of the electromagnetic horn 4 on the side of the open end is set at 41°.

How the reception field intensity is varied was measured in both cases that the reflection plates 44 are attached to the electromagnetic horn 4 and that the reflection plates 44 were not attached to the electromagnetic horn 4. As a result, it was found that, in case that the reception field intensity is 600 V/m without the reflection plates 44, the reception field intensity can be increased to 619 V/m when the reflection plate 44 is attached. The measurement was performed under the test conditions of the experiment 1 shown in FIG. 5. The length Lb of the waveguide 8 is set to 50 cm, and the space La between the electromagnetic horn 4 and the waveguide 8 is set to 25 cm.

From the results of this measurement, it is understood that, if the electromagnetic horn 41 is provided with the reflection plate 44 as in the present embodiment, the electromagnetic wave from the electromagnetic horn 4 can be more efficiently radiated to the specimen.

In case that the electromagnetic horn 41 is provided with the reflection plates 44, the reflection plates 44 may not be provided on the upper and lower peripheral faces but on left and right peripheral faces of the electromagnetic horn 41. Also, each of the reflection plates 44 may not be constituted from just one piece of metal plate but may be constituted by arranging a plurality of metal plates in substantially parallel, as a variation shown in FIG. 4. In this manner, it is possible to increase reflection efficiency of the electromagnetic wave by the reflection plates 44. The electromagnetic wave from the electromagnetic horn 4 can be more efficiently radiated to the specimen.

Embodiment 4

Figure 10:
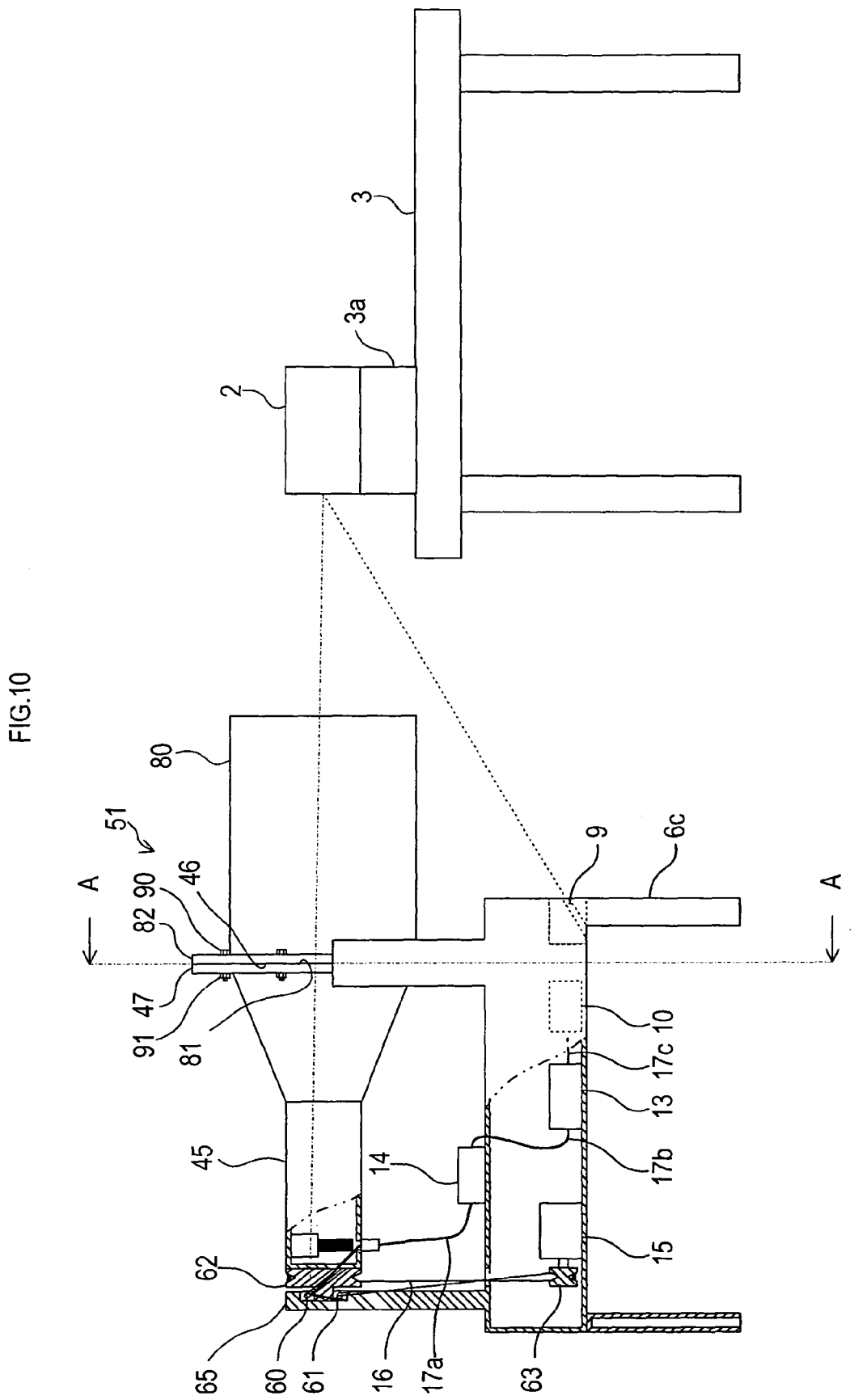
FIG. 10 is an explanatory view showing an embodiment in which a polarized wave face of an electromagnetic wave is adjustable.

Now, explanation on a fourth embodiment of the present invention is given referring to FIG. 10.

In the following description, the same reference numeral is given to the same component as that of the interference exclusion capability testing apparatus of the first embodiment, and the detailed explanation is not repeated.

In FIG. 10, a radiating antenna 51 is provided instead of the radiating antenna 5.

The radiating antenna 51 is designed to be able to adjust the polarized wave face of the electromagnetic wave radiated to the specimen 2 to arbitrary angles.

Reference numeral 6*c* denotes a platform, which is for rotatably holding the radiating antenna 51 on a radial axis 12.

Reference numeral 9 denotes a distance measurement device, which is a device for measuring a distance from an end face (on the side of the specimen) of a waveguide 80 to the specimen 2.

Reference numeral 15 denotes an electric motor, which is a power source for rotating the radiating antenna 51.

Reference numeral 16 denotes a belt for driving, which is used for transmitting power of the electric motor to the radiating antenna 51.

A flange 47 is formed on an open face of an electromagnetic horn 45.

Also, a flange 82 is formed on an end of the waveguide 80. An end face 46 of the flange 47 and an end face 81 of the flange 82 are abutted and fastened with a bolt 90 and a nut 91.

Also, a support body 61 and a pulley 62 are integrally formed at an end (on the side of the probe) of the electromagnetic horn 45.

A recess 65 is provided above the platform 6*c*. The recess 65 supports the support body 61 via a bearing 60.

Figure 11:
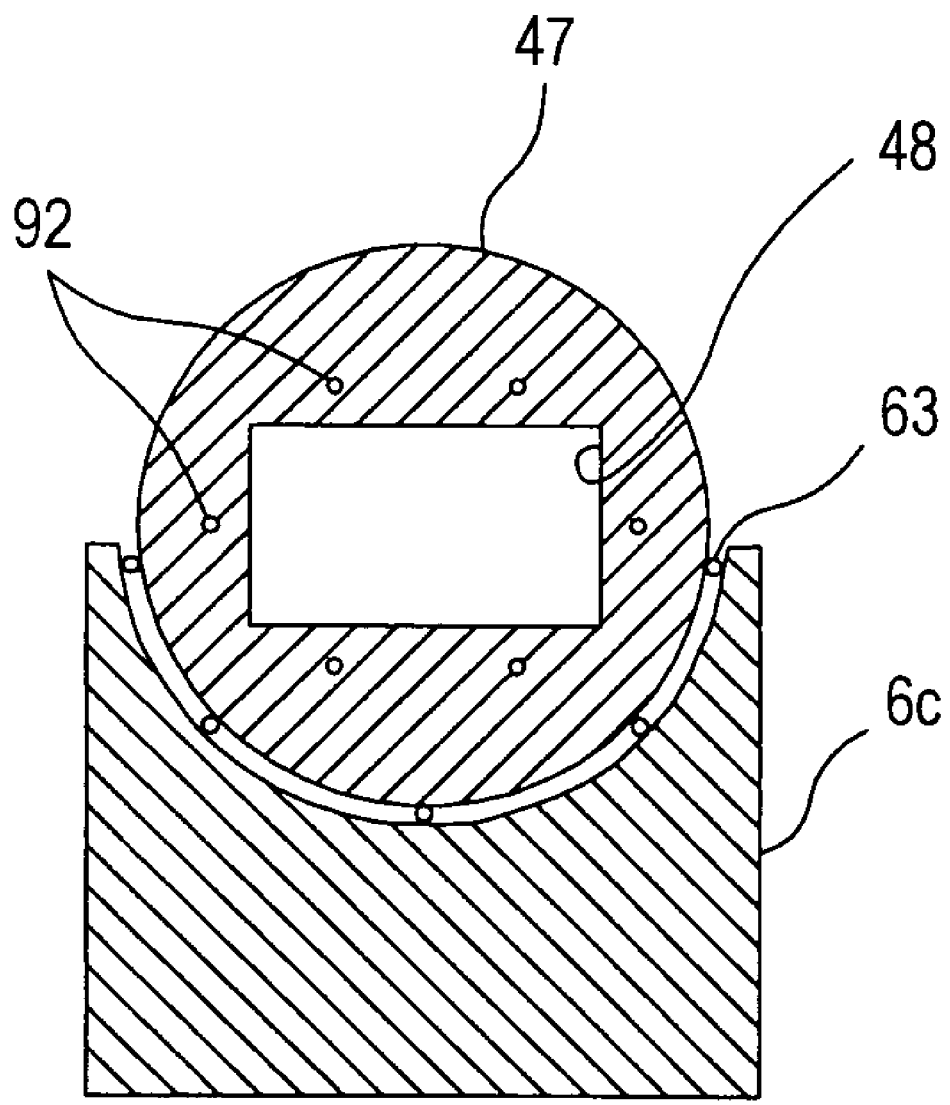
FIG. 11 is an end view taken by an arrow A-A of FIG. 8.

FIG. 11 shows an end view taken by an arrow A-A of FIG. 10. Reference numeral 48 denotes an opening of the electromagnetic horn 45. An opening of the waveguide 80 is also formed into the same shape.

Reference number 92 denotes a through hole for inserting the bolt 90.

A plurality of roller 64 are disposed so that the radiating antenna 5 is smoothly rotated.

Now, explanation on operation is given.

A predetermined electromagnetic field of the specimen 2 is radiated from the electromagnetic horn 45 via the waveguide 80 by a high frequency signal supplied to the radiating antenna 5.

In case that an interference exclusion capability is tested by changing a polarized wave face of the electromagnetic field to be radiated, it is possible to test the interference exclusion capability of the polarized wave face of an arbitrary angle on a test plane by driving the electric motor 15 to rotate the radiating antenna 51 on the radiation axis.

Now, explanation is given on the measuring method of the distance measurement device 9. As shown in FIG. 12, a plurality of distance measurement devices 9*a*, 9*b* are provided at a distance L3 below the radiating antenna 51 which radiates an electromagnetic wave.

As the distance measurement devices, laser pointers are used for example. A center of the test plane of the specimen 2 is irradiated by each laser pointer.

At this point, if an angle to a horizontal plane is θ1 and an angle to a vertical plane is θ2, a distance L4 from the open end of the waveguide 80 to the test plane of the specimen 2 can be calculated by an equation below.

$$L4 = (L3/2)\tan(\theta1)\sin(\theta2) - L5$$

L5 is an amount of protrusion of the waveguide 80, which is a known value.

Use of the laser pointers as such allows to relatively easily calculate the distance L4 from the end face of the waveguide 80 to the test plane of the specimen 2 without using a measurer.

It is desirable that values of the above θ1 and θ2 can be directly read.

In the above, the embodiments of the present invention have been described. However, the present invention should not be limited to the above described embodiments, but can be practiced by arbitrarily modifying each component within the scope not departing from the gist of the present invention.

Each of the above embodiments showed an example of the testing apparatus by means of an electromagnetic wave of a linearly polarized wave. However, interposition of a circularly polarized wave generator such as a retarder inside the electromagnetic horn (more particularly, between the probe 40 and the horn allows radiation of a circularly polarized electromagnetic wave, and thus, a test by means of a circularly polarized wave can be performed. Also, there was a description that the frequency of the electromagnetic wave is in a range of 1 GHz or 3 GHz. However, as the electromagnetic wave for use in an immunity test, an electromagnetic wave can be used if a frequency thereof is in a range from UHF to SHF.

In the present embodiments, there was a description that the platform 6 is a fixed platform. However, providing casters at a bottom of the platform can make the platform to be easily moved. It is desirable that the platform is provided with a function of locking rotation of the casters so that the platform may not be moved during measurement.

It is also possible to provide a detector which detects the reflection power between the circulator 14 and the power amplifier 13. If a detection signal outputted by the detector exceeds a predetermined value, a signal level outputted from the signal generator may be reduced or OFF.

Constitution as above provides an effect of inhibiting failure of the power amplifier by reflection power.

Each of the above embodiments explained that an opening area of the waveguide 8 (or 80) corresponds to that of the opening of the electromagnetic horn 4 (45). However, for example even if the opening area of the waveguide 8a is wider than that of the opening area of the electromagnetic horn 4 as shown in FIGS. 13 (a-1) and (a-2), or even if the opening area of the waveguide 8b is narrower than that of the electromagnetic horn 4 as shown in FIGS. 13 (b-1) and (b-2), it is possible to correct a radiation direction of the electromagnetic horn 4 to be guided to the specimen.

Also, even if a waveguide 8c is tapered such that the opening on the side of the specimen is narrower than the opening on the side of the electromagnetic horn 4 as shown in FIGS. 13 (c-1) and (c-2), or even if a waveguide 8d is tapered such that the opening on the side of the specimen is wider than the opening on the side of the electromagnetic horn 4 as shown in FIGS. 13 (d-1) and (d-2), it is possible to correct a radiation direction of the electromagnetic wave from the electromagnetic horn 4 to be guided to the specimen. Or, the effect can be obtained only by providing waveguides 8e and 8f in a horizontal or vertical direction as shown in FIGS. 13 (e-1) and (e-2).

In FIGS. 13(a) to (e), a figure with a suffix "-1" is a side view of the electromagnetic horn 4 and the waveguide 8 viewed from a lateral direction, and a figure with a suffix "-2" is an explanatory view showing a state of the opening face of the electromagnetic horn 4 viewed through the waveguide 8. It is not always necessary that the aforementioned waveguide plates 8e and 8f and waveguides 8a to 8d are formed by metal plates, but may be composed with a mesh having a shielding effect.

Figure 14:
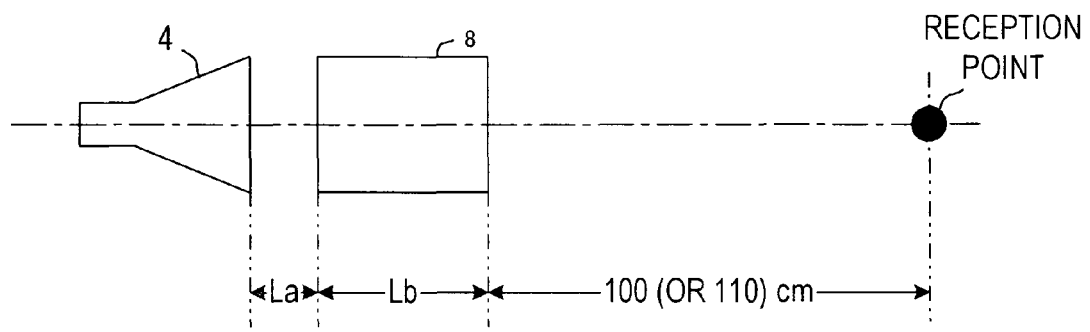
FIG. 14 is an explanatory view that explains another example of test conditions of an immunity test.

In explanation of each of the above embodiments, there was a description that a distance between the open end of the electromagnetic horn 4 to the specimen (reception point) is defined in test conditions of an immunity test. However, even if a distance from the open end on the side of the specimen of the waveguide 8 to the specimen is defined as a test condition as shown in FIG. 14, a testing apparatus can be implemented which can efficiently radiate an electromagnetic wave to a specimen by setting the length Lb of the waveguide 8 and the distance La between the electromagnetic horn 4 and the waveguide 8.

Also, explanation of the above embodiments did not specifically describe a size of the electromagnetic horn 4 itself. However, an antenna gain of the radiating antenna 5 is determined by the opening area and an amount of gain reduction of the electromagnetic horn 4. The larger the opening area of the electromagnetic horn 4 is, the larger the antenna gain of the radiating antenna 5 becomes. Also, the longer a length of the electromagnetic horn 4 in a central axial direction is, the smaller the amount of gain reduction of the electromagnetic horn 4 becomes.

Figure 15:
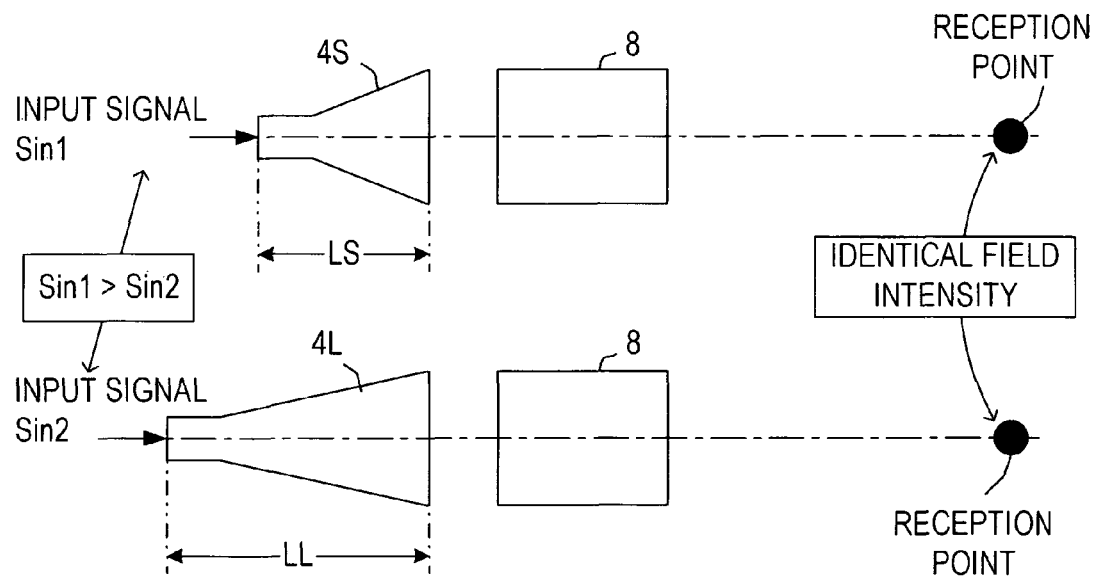
FIG. 15 is an explanatory view that explains a change in reception field intensity by a length of the electromagnetic horn.

That is, as shown in FIG. 15, in each of cases in which an electromagnetic horn 4S having a length LS is used as the electromagnetic horn 4 and in which an electromagnetic horn 4L having a length LL (LL>LS) is used, input signals Sin1 and Sin2 to be supplied to the respective electromagnetic horns 4S and 4L to have field intensities at the reception point identical to each other can be set to different signal levels. The electromagnetic horn 4L which is longer can better reduce the signal level of the input signal.

Accordingly, in order to increase the antenna gain of the radiating antenna 5 and improve radiation efficiency of the electromagnetic wave, it is advantageous to use the electromagnetic horn 4 having a long length in the central axial direction.

The invention claimed is:

1. An interference exclusion capability testing apparatus for use in testing interference exclusion capability of a specimen, comprising:
   a radiating antenna that radiates an electromagnetic wave toward the specimen, the radiating antenna including
      an electromagnetic horn, and
      a waveguide that is arranged between the electromagnetic horn and the specimen and that guides an electromagnetic wave radiated from the electromagnetic horn to the specimen;
   wherein a distance from an open end face of the electromagnetic horn to the specimen and a frequency of the electromagnetic wave radiated from the electromagnetic horn are defined as test conditions for the specimen;
   wherein an axial length of the waveguide is set to about half of the distance from the open end face of the electromagnetic horn to the specimen defined in the test conditions; and
   wherein a space between the electromagnetic horn and the waveguide is set to a distance approximately equal to a wavelength of the electromagnetic wave.

2. The interference exclusion capability testing apparatus according to claim 1, wherein a support member is provided which supports the waveguide to be attached to and detached from the electromagnetic horn.

3. The interference exclusion capability testing apparatus according to claim 2,
wherein the support member is composed of a slide rail and a plurality of supports which are movably provided on the slide rail and support the waveguide.

4. The interference exclusion capability testing apparatus according to claim 1,
wherein the electromagnetic horn is designed such that a rotating device is provided which rotates the electromagnetic horn on a radial axis of the electromagnetic horn, and an electromagnetic wave of a linearly polarized wave is radiated from the electromagnetic horn.

5. The interference exclusion capability testing apparatus according to claim 1,
wherein a reflector plate which reflects and guides the electromagnetic wave going behind from an open face of the electromagnetic horn to the specimen is provided around the electromagnetic horn.

* * * * *